(12) United States Patent
Nohara et al.

(10) Patent No.: US 7,869,193 B2
(45) Date of Patent: Jan. 11, 2011

(54) POWER CONVERSION APPARATUS

(75) Inventors: Shuhei Nohara, Kitakyushu (JP);
Toshihiro Mori, Kitakyushu (JP);
Hidenori Hara, Kitakyushu (JP)

(73) Assignee: Kabushiki Kaisha Yaskawa Denki, Fukuoka (JP)

( * ) Notice: Subject to any disclaimer, the term of this patent is extended or adjusted under 35 U.S.C. 154(b) by 171 days.

(21) Appl. No.: 12/279,318

(22) PCT Filed: Jan. 29, 2007

(86) PCT No.: PCT/JP2007/051359

§ 371 (c)(1),
(2), (4) Date: Aug. 13, 2008

(87) PCT Pub. No.: WO2007/094162

PCT Pub. Date: Aug. 23, 2007

(65) Prior Publication Data

US 2009/0015992 A1    Jan. 15, 2009

(30) Foreign Application Priority Data

Feb. 17, 2006   (JP) .............................. 2006-040059

(51) Int. Cl.
*H02B 1/26*  (2006.01)
*H02B 1/20*  (2006.01)
*H02M 7/537* (2006.01)
*H02M 1/00*  (2006.01)
*H05K 7/00*  (2006.01)

(52) U.S. Cl. ................... 361/624; 363/131; 363/144; 361/728; 361/637

(58) Field of Classification Search ............. 361/624, 361/637, 728; 363/131, 144
See application file for complete search history.

(56) References Cited

U.S. PATENT DOCUMENTS

| | | | | |
|---|---|---|---|---|
| 4,992,925 A | * | 2/1991 | Meyer | 363/141 |
| 5,132,896 A | * | 7/1992 | Nishizawa et al. | 363/144 |
| 5,365,424 A | * | 11/1994 | Deam et al. | 363/144 |
| 5,517,063 A | * | 5/1996 | Schantz et al. | 307/9.1 |
| 5,623,399 A | * | 4/1997 | Ishii et al. | 363/132 |

(Continued)

FOREIGN PATENT DOCUMENTS

JP    2001-128467 A    5/2001

(Continued)

*Primary Examiner*—Jayprakash N Gandhi
*Assistant Examiner*—Bradley H Thomas
(74) *Attorney, Agent, or Firm*—Sughrue Mion, PLLC

(57) ABSTRACT

The connection between the terminals of three-phase electric parts used in a matrix converter is simplified to thereby reduce the inductance between conductors. An AC capacitor and an IGBT are disposed such that the linearly arranged terminals of the AC capacitor and the linearly arranged input terminals of the IGBT are parallel to each other, and also that the three terminals of the AC capacitor and the three input terminals of the IGBT are situated close to each other. A bus bar is formed as a laminate bus bar which can be provided by laminating three plate-shaped bus bars on top of each other. In the respective plate-shaped bus bars, there are provided internal terminals for connecting together the mutually adjoining ones of the three-portion terminals of the AC capacitor and the three-portion input terminals of the IGBT, and the mutually adjoining terminals are connected together through the internal terminals.

1 Claim, 6 Drawing Sheets

U.S. PATENT DOCUMENTS

| | | | |
|---|---|---|---|
| 6,028,779 A * | 2/2000 | Sakamoto et al. | 363/55 |
| 6,181,590 B1 * | 1/2001 | Yamane et al. | 363/132 |
| 6,215,679 B1 * | 4/2001 | Yamane et al. | 363/132 |
| 6,249,448 B1 * | 6/2001 | Regnier et al. | 363/144 |
| 6,326,761 B1 * | 12/2001 | Tareilus | 318/722 |
| 6,327,165 B1 * | 12/2001 | Yamane et al. | 363/132 |
| 6,493,249 B2 * | 12/2002 | Shirakawa et al. | 363/147 |
| 6,525,950 B1 * | 2/2003 | Shirakawa et al. | 363/144 |
| 6,618,278 B2 * | 9/2003 | Suzuki et al. | 363/144 |
| 6,629,854 B2 * | 10/2003 | Murakami | 439/251 |
| 6,791,854 B2 * | 9/2004 | Shirakawa et al. | 363/147 |
| 6,843,335 B2 * | 1/2005 | Shirakawa et al. | 180/65.1 |
| 6,870,253 B1 * | 3/2005 | Ushijima | 257/691 |
| 6,943,445 B2 * | 9/2005 | Shirakawa et al. | 257/724 |
| 6,987,670 B2 * | 1/2006 | Ahmed et al. | 361/699 |
| 7,151,661 B2 * | 12/2006 | Kimura et al. | 361/306.3 |
| 7,248,483 B2 * | 7/2007 | West | 361/801 |
| 2002/0180037 A1 * | 12/2002 | Shirakawa et al. | 257/727 |
| 2004/0230847 A1 * | 11/2004 | Patwardhan et al. | 713/300 |
| 2005/0161809 A1 * | 7/2005 | Nakatsu et al. | 257/734 |
| 2006/0232942 A1 * | 10/2006 | Nakatsu et al. | 361/710 |
| 2006/0239050 A1 * | 10/2006 | Andersson et al. | 363/132 |
| 2006/0284308 A1 * | 12/2006 | Harada et al. | 257/729 |
| 2007/0076355 A1 * | 4/2007 | Oohama | 361/676 |
| 2007/0183130 A1 * | 8/2007 | Yamabuchi et al. | 361/728 |

FOREIGN PATENT DOCUMENTS

| | | |
|---|---|---|
| JP | 2002-203941 A | 7/2002 |
| JP | 2004-236374 A | 8/2004 |
| JP | 2005-65357 A | 3/2005 |
| JP | 2005-65412 A | 3/2005 |

* cited by examiner

POWER CONVERSION APPARATUS

TECHNICAL FIELD

The present invention relates to a method for structuring a bus bar which, in a motor controller (a matrix converter, an inverter, a servo controller and the like), a power supply apparatus (a UPS, a welding machine power supply and the like), and the like, is used to connect a power module, a capacitor, a reactor and the like.

PRIOR ART

Conventionally, a power module such as an Insulated Gate Bipolar Transistor (IGBT) or an Intelligent Power Module (IPM) is connected to an electric part such as a capacitor or a reactor by cable wiring or a bus bar. Also, in an inverter and the like, there is employed a structure in which bus bars arranged in the dc portion of an electric circuit are laminated on top of each other. (For example, Japanese Patent Publication 2005-65412).

Patent Reference 1: JP-A-2005-65412

DISCLOSURE OF THE INVENTION

Problems to be solved by the Invention

In the conventional cable wiring, an assembling operation is carried out while working a cable according to the positions of electric parts and terminals, and, in many cases, at the same time when the cable is fixed, other terminals and electric parts are joined together, which results in the complicated operation. In this case, the wiring distance and route are liable to vary, which makes it necessary to add a surge voltage restraint circuit allowing an increase in the inductance, or increase the size of the surge voltage restraint circuit. This raises a problem that the apparatus including these electric parts and terminals increases in size and becomes complicated in structure. Also, the terminals of the electric parts, in most cases, are disposed close to each other. Thus, when wrong wiring occurs due to the wrong connection of a cable in the cable wiring operation, or when terminals and electric parts to be mounted simultaneously are joined together in such a manner that the different poles of the terminals and electric parts are contacted with each other, there is a fear that the apparatus and the parts thereof can be damaged.

On the other hand, also when wiring is carried out using a bus bar, if the connecting routes of the electric parts and the terminals thereof are not proper, the route of the bus bar is complicated. This raises a problem that a surge voltage can increase due to the increased inductance, a radiation noise can increase, and heat can be generated due to the increases electric resistance.

The invention aims at solving the above problems found in the conventional technology. Thus, it is an object of the invention to provide a bus bar structuring method which can connect together the terminals of the electric parts properly using a bus bar, can simplify the connecting operation, and can reduce the inductance by inserting thin-plate-shaped insulators into between the respective conductor layers.

Means for Solving the Problems

In attaining the above object, according to the invention, there is provided a matrix converter which has the following structure.

According to a first aspect of the invention, there is provided a matrix converter including:

an alternating current (AC) capacitor including linearly arranged first, second and third terminals respectively formed in the three portions thereof;

an IGBT including linearly arranged first, second and third input terminals respectively formed in the three portions thereof; and a bus bar for connecting together the three-portion terminals of the AC capacitor and the three-portion input terminals of the IGBT, wherein the AC capacitor and the IGBT are disposed such that the linearly arranged terminals of the AC capacitor and the linearly arranged input terminals of the IGBT are parallel to each other and the first, second and third input terminals of the IGBT are respectively close to the first, second and third terminals of the AC capacitor, and the bus bar is formed as a laminate bus bar provided in such a manner that three plate-shaped bus bars are laminated on top of each other and insulators are inserted between the respective bus bars as well as on the front and back surfaces of the bus bars, in the respective plate-shaped bus bars, there are provided internal terminals for connecting together the three-portion terminals of the AC capacitor and the three-portion input terminals of the IGBT, and the terminals of the AC capacitor and the input terminals of the IGBT are connected together through the internal terminals.

Further, according to a second aspect of the invention, there is provided the matrix converter as set forth in the first aspect, wherein the AC capacitor and the IGBT are disposed such that the surfaces of the three-portion terminals of the AC capacitor and the surfaces of the three-portion input terminals of the IGBT are on the same plane, and the three plate-shaped bus bars are respectively formed to have the same substantially rectangular shape and are laminated on top of each other.

Further, according to a third aspect of the invention, there is provided the matrix converter as set forth in the second aspect, wherein in the three plate-shaped bus bars, there are formed hole portions which respectively penetrate through between the first terminal and the first input terminal and through between the third terminals and the third input terminal, and a current route formed between the first terminal and the first input terminal and detouring the hole portions, and a current route formed between the third terminal and the third input terminal and detouring the hole portions are respectively set to substantially overlap a current route formed between the second terminal and the second input terminal.

Further, according to a forth aspect of the invention, there is provided the matrix converter as set forth in the first aspect, wherein the AC capacitor and the IGBT are disposed such that the surfaces of the three-portion terminals of the AC capacitor and the surfaces of the three-portion input terminals of the IGBT are on the same plane, and the three plate-shaped bus bars are laminated on top of each other in such a manner that the centrally situated bus bar is formed to have a substantially rectangular shape, the remaining two bus bars are formed to have substantially U-like shapes respectively facing in the mutually opposite directions, the two substantially U-shaped bus bars holding the substantially rectangular shaped bus bar between thereof through the insulators.

Still further, according to a fifth aspect of the invention, there is provided the matrix converter as set forth in the first aspect, wherein the AC capacitor and the IGBT are disposed such that the surfaces of the three-portion terminals of the AC capacitor and the surfaces of the three-portion input terminals of the IGBT are substantially perpendicular to each other, and the three plate-shaped bus bars are formed in part to have a substantially right angle.

EFFECTS OF THE INVENTION

According to the invention as set forth in claims 1 and 2, the terminals of the electric parts can be connected together in the shortest manner, thereby being able to simplify the assembling operation of the matrix converter.

According to the invention as set forth in claims 3 and 4, the inductances between the respective layers can be reduced, thereby being able to reduce the number of the surge voltage restraint circuits, the sizes of the respective surge voltage restraint circuits, the heat generation amounts of the surface voltage restraint circuits, the noises that are generated by the surface voltage restraint circuits, and the like. Also, even when the terminals of the electric parts cannot be connected in the shortest manner, the wiring routes can be arranged equally.

According to the invention as set forth in claim 5, even when the position relationship between the AC capacitor and IGBT is substantially at right angles due to the convenience of the design, there can be obtained similar effects to the above.

DESCRIPTION OF REFERENCE NUMERALS AND SIGNS

Figure 1:
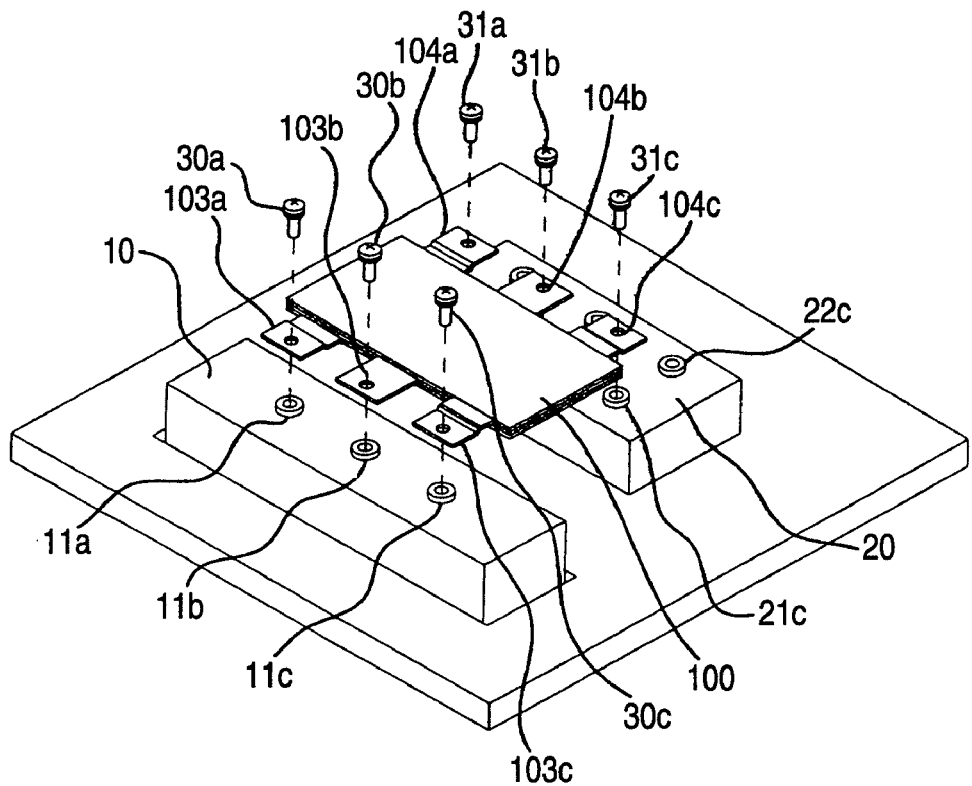
FIG. 1 is a perspective view of a first embodiment according to the bus bar structuring method of the invention.

10: AC capacitor
11a, 11b, 11c: Terminal
20: IGBT
21a, 21b, 21c: Input terminal
22a, 22b, 22c: Output terminal
30a, 30b, 30c: Screw
31a, 31b, 31c: Screw
100: Laminate bus bar
101a, 101b, 101c: Bus bar
102a, 102b, 102c, 102d: Insulator
103a, 103b, 103c: Internal terminal
104a, 104b, 104c: Internal terminal
105: Area A
111a, 111b, 111c: Bus bar
121a, 121b, 121c: Bus bar
130: Laminate bus bar
131a, 131b, 131c: Bus bar
132, 132a, 132b, 132c, 132d: Insulator
133a, 133b, 133c: Internal terminal
134a, 134b, 134c: Internal terminal
135: Area A
140: Laminate bus bar
141a, 141b, 141c: Bus bar
142, 142a, 142b, 142c, 142d: Insulator
143a, 143b, 143c: Internal terminal
144a, 144b, 144c: Internal terminal
145: Area A
146a, 146b, 146c: Area B

BEST MODE FOR CARRYING OUT THE INVENTION

Now, description will be given below of embodiments according to the invention with reference to the accompanying drawings.

Embodiment 1

Figure 11:
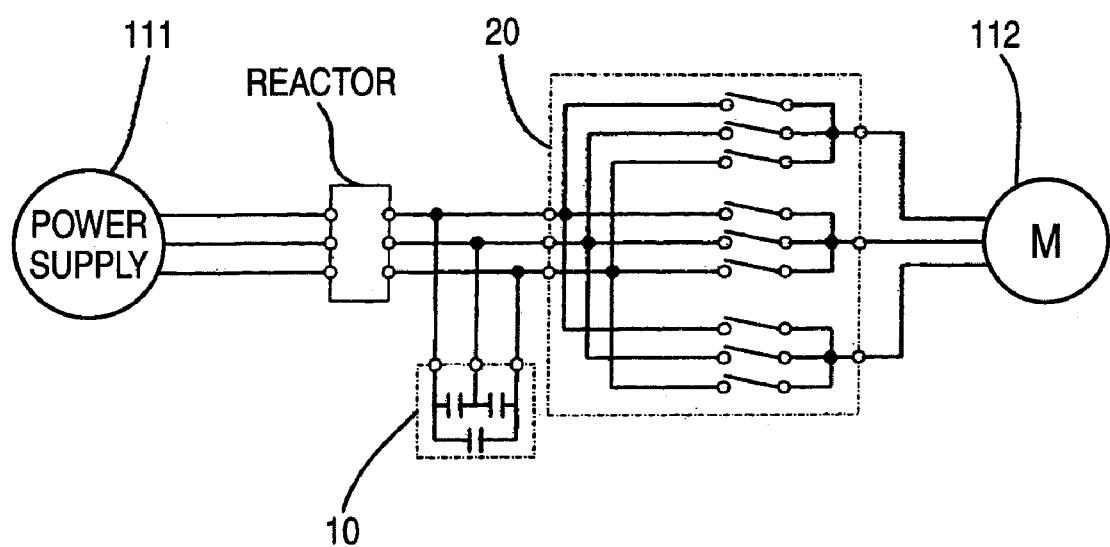
FIG. 11 is a structure view of a main circuit of a matrix converter.

FIG. 11 is a structure view of a main circuit of a typical matrix converter to which a bus bar according to the invention is applied. In FIG. 11, reference numeral 111 designates a three-phase AC power supply, 112 a motor which is driven by the matrix converter, 20 an IGBT module (which is hereinafter referred to as an IGBT) incorporating a two-way switch therein, and 10 a capacitor group (which is hereinafter referred to as an AC capacitor) incorporating a capacitor for a filter therein, respectively. That is, in the matrix converter, to the three-phase power supply, there are connected the AC capacitor 10 for a filter and the IGBT 20 with a two-way switch. In the matrix converter, in order to attain the direct ac-ac conversion, the two-way switch of the IGBT is frequently connected and disconnected, which requires means for reducing a surge voltage that occurs between the AC capacitor and IGBT due to the frequent connection and disconnection of the two-way switch. Therefore, when connecting together these elements, it is indispensable to reduce the inductance.

Figure 6:
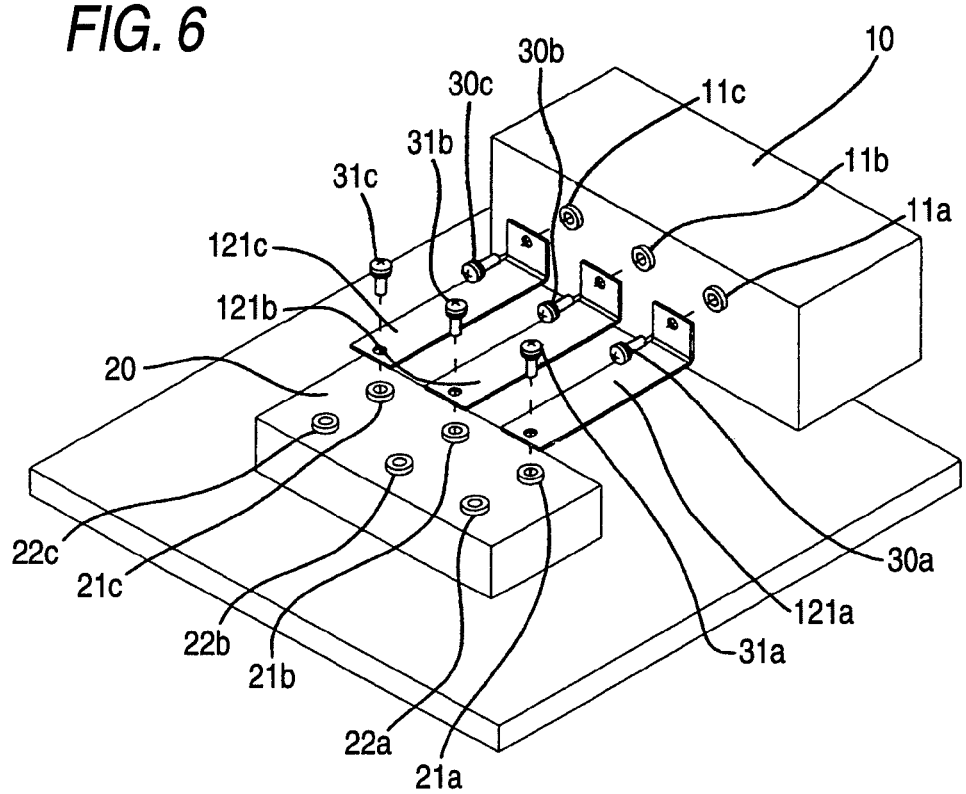
FIG. 6 is a perspective view of a third embodiment according to the bus bar structuring method of the invention.

FIG. 1 shows a method for structuring a bus bar according to the invention and it is a perspective view of a general structure of a matrix converter, showing a state thereof in which the AC capacitor 10 and IGBT 20 are connected together using a laminate bus bar 100. In this case, an AC power supply is connected to terminals 11a, 11b and 11c of the AC capacitor 10 through a reactor (not shown). At the same time, to the terminals 11a, 11b and 11 c, there are fixed the internal terminals 103a, 103b and 103c of a laminate bus bar 100 by screws 30a, 30band 30c respectively, while they are connected together electrically. While the internal terminals 103a, 103b and 103c of the laminate bus bar 100 are electrically connected to internal terminals 104a, 104b and 104c respectively, the internal terminals (104a), 103b (104b) and 103c (104c) are electrically isolated from each other. The detailed description of the laminate bus bar 100 will be given later with reference to FIGS. 2, 3 and 4. The internal terminals 104a, 104b and 104c of the laminate bus bar 100 are fixed to the input terminals 21a, 21b and 21c of the IGBT 20 by screws 31a, 31b and 31c respectively, while they are electrically connected to each other. IGBT 20 directly converts AC currents, which are input to the input terminals 21a, 21b and 21c thereof, and outputs the AC currents to the output terminals 22a, 22b and 22c thereof. To the output terminals 22a, 22b and 22c, there is connected a motor (not shown here). In addition, although not shown, snubber circuits, each of which includes a capacitor, a resistor and a diode, are respectively connected between the input terminal 21a and output terminal 22a, between the input terminal 21b and output terminal 22b, and between the input terminal 21c and output terminal 22c. Also, AC capacitor 10 and IGBT 20 are disposed close to each other such that the distances between the terminal 11a and input terminal 21a, between the terminal 11b and input terminal 21b, and between the terminal 11c and input terminal 21c can be shortest respectively. By the way, although the input terminals 21a, 21b and the output terminals 22a, 22b are not shown in FIG. 2 for convenience of illustration, the position relationship between the input terminals 21a, 21b, 21c and output terminals 22a, 22b, 22c of IGBT 20 is the same as shown in FIG. 6.

Figure 2:
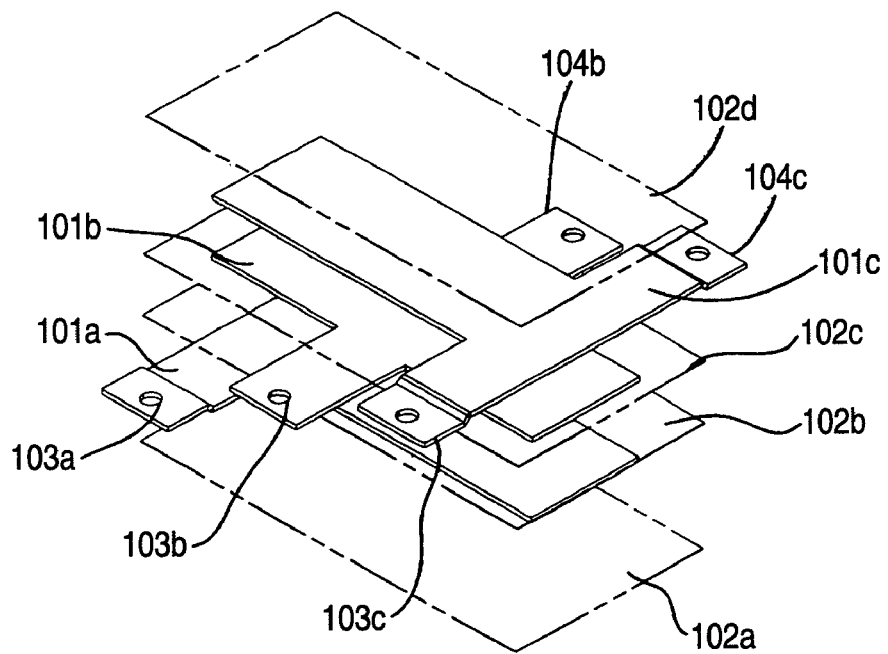
FIG. 2 is a perspective view of a bus bar structuring method according to the first embodiment.
Figure 3:
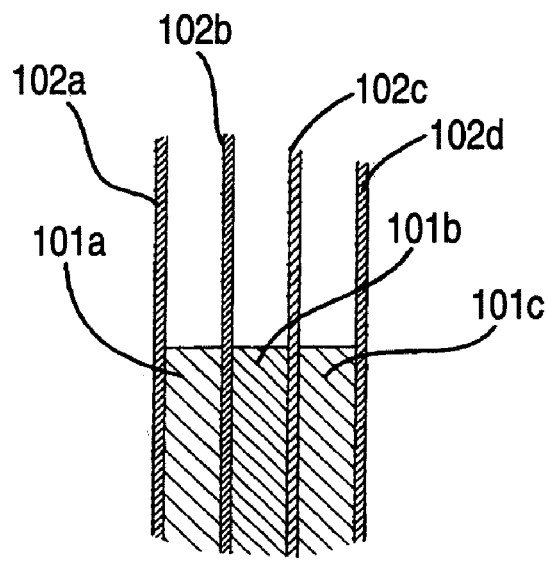
FIG. 3 is a section view of a bus bar according to the first embodiment.
Figure 4:
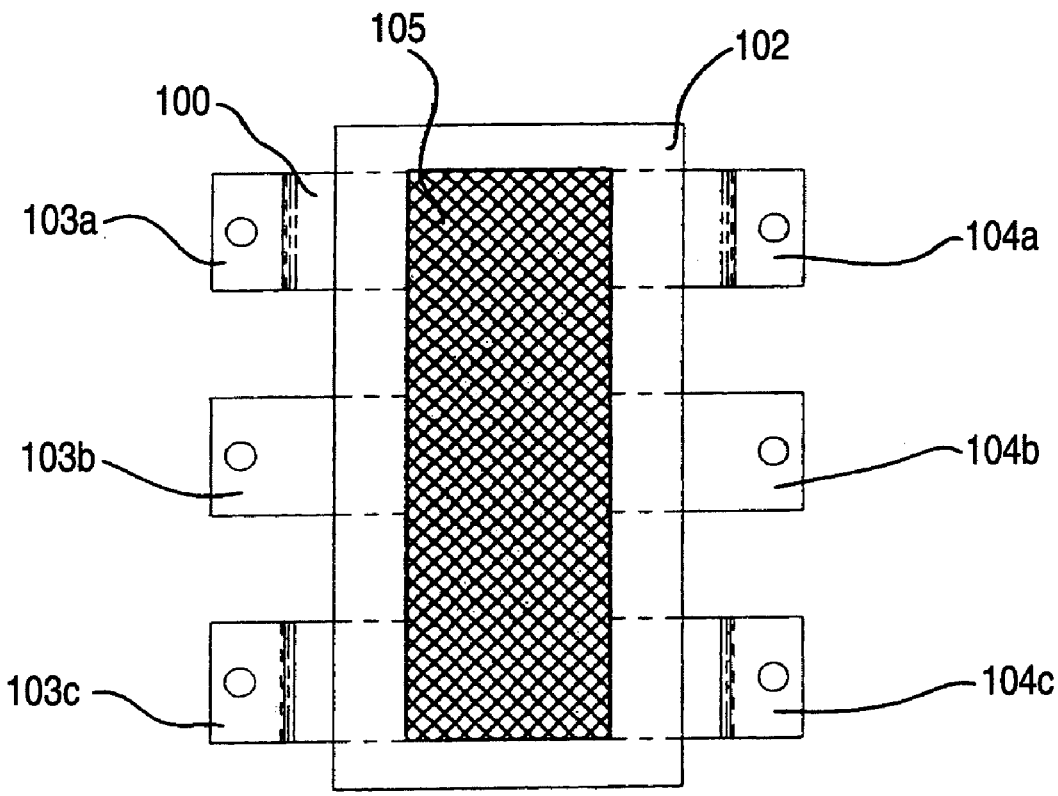
FIG. 4 is a perspective view of the bus bar according to the first embodiment, when it is seen through from the upper surface thereof.

Referring to a method for structuring the laminate bus bar 100, as shown in FIG. 2, thin-plate-shaped insulators 102b and 102c are respectively inserted between plate-shaped conductors 101a, 101b and 101c, and insulators 102a and 102d are placed on the outer surfaces of the bus bars 101a and 101c respectively. The bus bar 101a is made of a conductor which is a copper-system alloy with copper as a main component thereof or an aluminum-system alloy; and, between the internal terminals 103a and 104a, electric resistance is small. This also applies to the bus bars 101b and 101c similarly. The insulators 102a, 102b, 102c and 102d are each made of a thin-plate-shaped insulator such as aramid paper, PET (polyethylene terephthalate), or a laminated mica sheet. FIG. 3 is a section view of the laminate bus bar 100. The plate-shaped conductors 101a, 101b and 101c are respectively closely and parallel contacted with the thin-plate-shaped insulators 102b and 102c that are inserted between the conductors 101a, 101b and 101c, thereby being able not only to insulate the bus bars from each other but also to reduce the inductance between the bus bars. Also, owing to the provision of the insulators 102a and 102d on the outer surfaces of the bus bars, the entire areas of the outer surfaces of the bus bars except for the peripheral portions of the internal terminals function as an insulator, thereby being able to secure insulation when mounting other parts on the bus bars themselves and on the peripheral portions of the bus bars. FIG. 4 is a perspective view of the laminate bus bar 100 when it is seen through from the top surface thereof. The internal terminals 103a, 103b and 103c as well as the internal terminals 104a, 104b and 104c are formed at positions where they are not laminated on top of each other, and the bus bars have the shapes that adjoin each other on the entire surface of the area A 105 where the routes of the bus bars are laminated on top of each other, thereby being able to reduce the inductance further.

Since the terminals of the electric parts are connected together by the above-structured laminate bus bar, an assembling operation to be executed for the above connection can be simplified, thereby being able to reduce the inductance between the bus bars.

Embodiment 2

Figure 5:
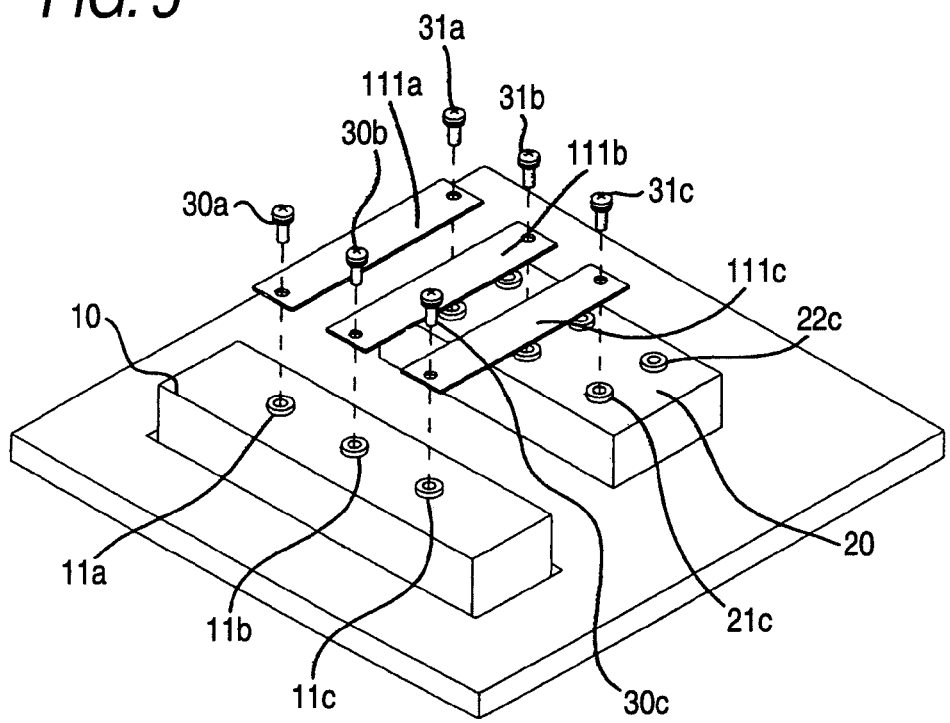
FIG. 5 is a perspective view of a second embodiment according to the bus bar structuring method of the invention.

FIG. 5 shows the structure of a second embodiment according to the invention. According to the present embodiment, the terminal 11a and input terminal 21a, the terminal 11b and input terminal 21b, and the terminal 11c and input terminal 21c are connected together respectively by their associated bus bars 111a, 111b and 111c. Since the terminals and input terminals can be connected together in a linear manner, and also since the mutually adjoining bus bars are arranged parallel to each other, thereby being able to prevent the terminal and input terminal from being connected in a wrong-combination. Also, the position relationships between the terminals and input terminals to be connected together are the same, which makes it possible to use the bus bars in common.

Embodiment 3

FIG. 6 shows the structure of a third embodiment according to the invention. According to the present embodiment, the AC capacitor 10 and IGBT 20 are disposed such that the terminals 11a, 11b, 11c are respectively perpendicular to their associated input terminals 21a, 21b, 21c. This is the arrangement that can occur owing to various limits in design such as the mounting of other parts, the design of heat and the design of insulation. When the bus bars 121a, 121b and 121c, which are respectively used to connect together the terminal 11a and input terminal 21a, the terminal 11b and input terminal 21b, and the terminal 11c and input terminal 21c, are equally bent in the intermediate portions of the routes thereof, the wiring routes thereof can be made equal to each other. Also, even when other part is mounted between the terminal and input terminal, by equally bending the bus bars to thereby detour the routes, the wiring distances can be made equal to each other.

Embodiment 4

Figure 7:
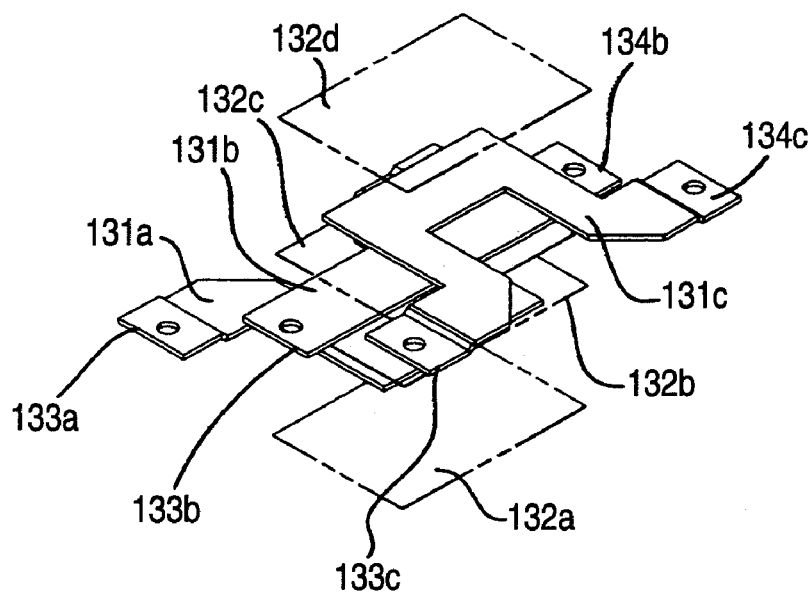
FIG. 7 is a perspective view of a fourth embodiment according to the bus bar structuring method of the invention.
Figure 8:
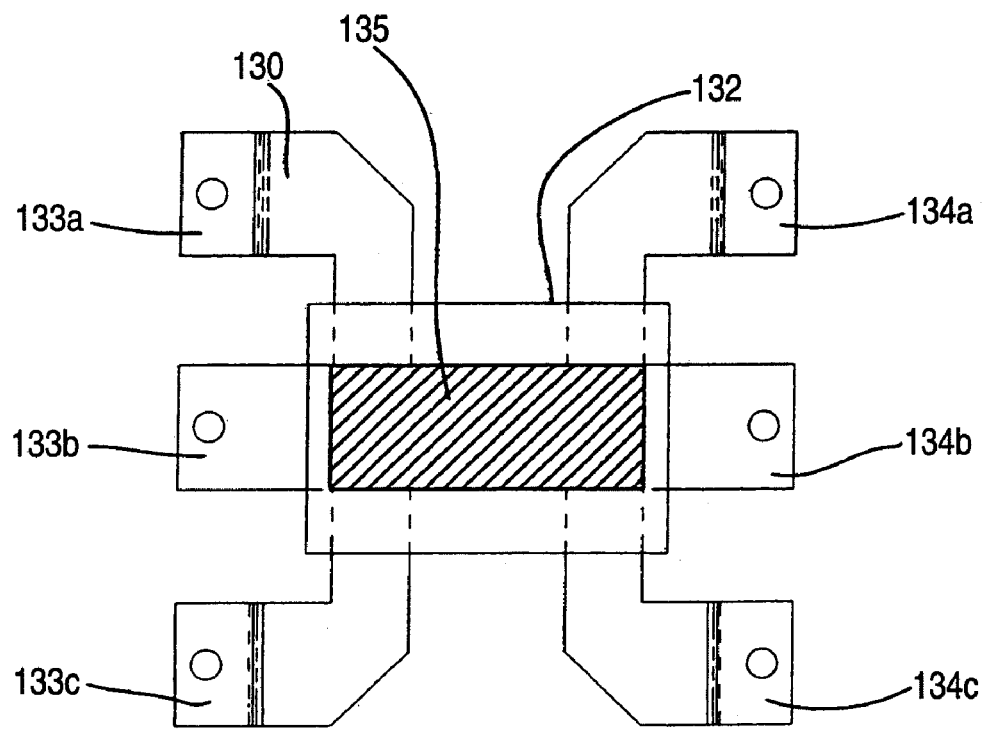
FIG. 8 is a perspective view of a bus bar according to the fourth embodiment, when it is seen through from the upper surface thereof.

FIG. 7 shows the structure of a fourth embodiment according to the invention. According to this structure, thin-plate-shaped insulators 132b and 132c are respectively inserted into between plate-shaped conductive bus bars 131a, 131b and 131c, and insulators 132a and 132d are respectively disposed and laminated on the outer surfaces of the bus bars 131a and 131c. The bus bar 131b is formed to have a linear shape, while the bus bars 131a and 131c are formed such that they are arranged parallel to each other and are laminated on top of each other in the route of the bus bar 131b. FIG. 8 is a perspective view of a laminate bus bar 130, showing a state where it is seen through from the top surface thereof. The internal terminals 133a, 133b, 133c of the bus bar 130 and the internal terminals 134a, 134b, 134c thereof are formed at such positions that they are not laminated on top of each other; and, the bus bars respectively have such shapes that adjoin each other in an area A 135 where the routes of the bus bars 131a and 131c are laminated on top of the route of the bus bar 131b. When the area where the bus bars adjoin each other is narrowed, the bus bars and insulators can be made compact.

When the bus bars and insulators can be made compact, the materials of them can be saved and also other parts can be mounted in such a manner that they are disposed close to each other, thereby being able to reduce the size of an apparatus incorporating such bus bars and insulators therein.

Embodiment 5

Figure 9:
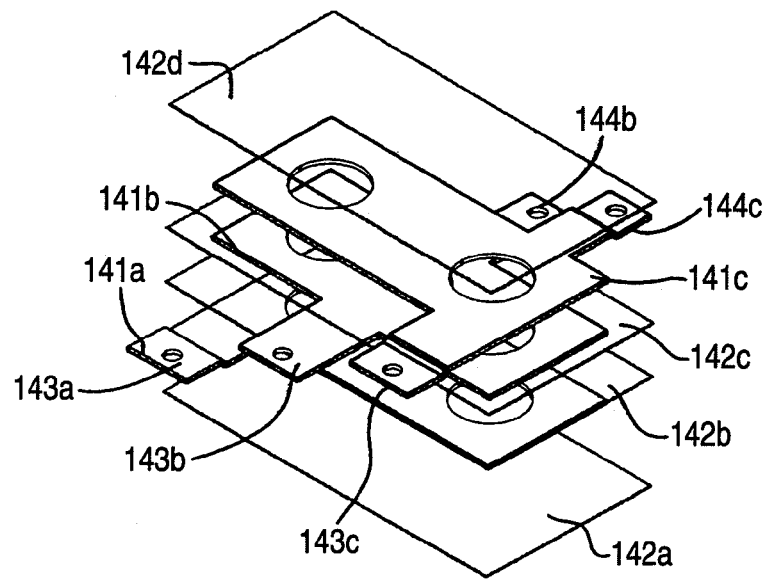
FIG. 9 is a perspective view of a fifth embodiment according to the bus bar structuring method of the invention.
Figure 10:
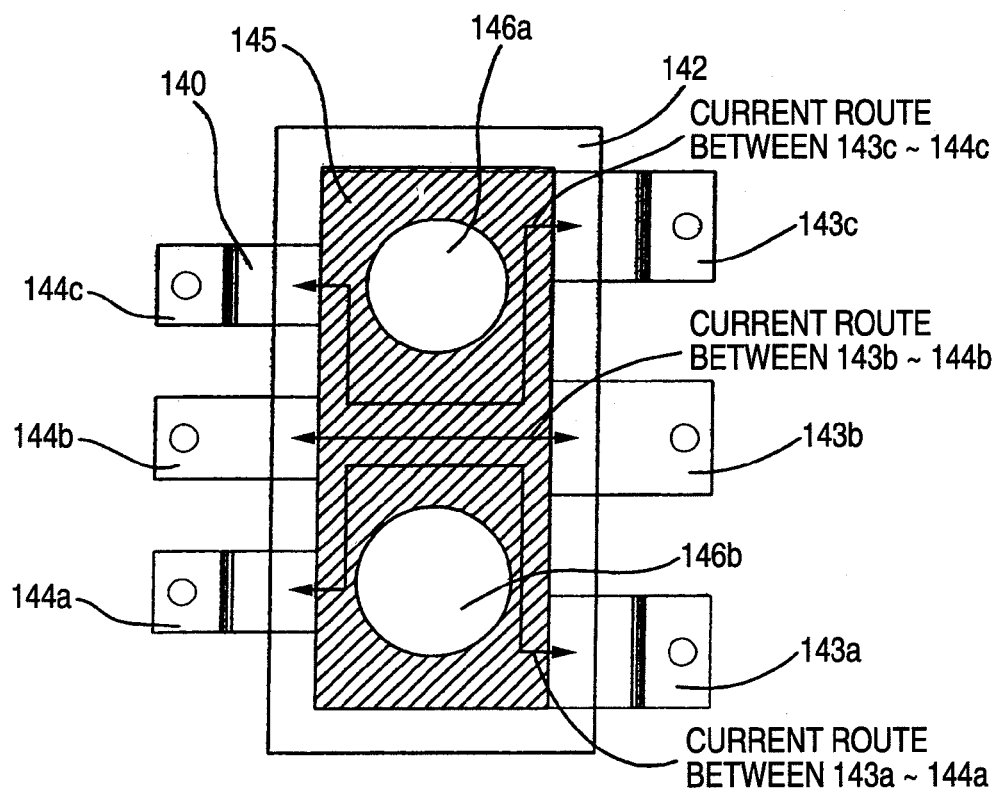
FIG. 10 is a perspective view of a bus bar according to the fifth embodiment, when it is seen through the upper surface thereof.

FIG. 9 shows the structure of a fifth embodiment according to the invention. According to the present structure, thin-plate-shaped insulators 142b and 142c are respectively inserted into between plate-shaped conductor bus bars 141a, 141b, 141c, and insulators 142a and 142d are respectively disposed on and laminated on the outer surfaces of the bus bars 141a and 141c. In the bus bars 141a, 141b and 141c, there are formed holes in the same areas thereof. FIG. 10 is a perspective view of a laminate bus bar 140, showing a state where it is seen through from the top surface thereof. For the sake of partner parts to be connected, the distance between the internal terminals 143a, 143b, 143c of the bus bar 140 is set smaller than the distances between the internal terminals 144a, 144b, 144c thereof. Here, in the bus bars 141a, 141b and 141c, there are formed holes (areas B) 146a and 146b. Owing to the formation of the holes, a current route between the internal terminals 143a~144a and a current route between the internal terminals 143c~144c are detoured, thereby resulting in the routes that are shown by arrow marks in FIG. 10. Therefore, since these detoured routes overlap substantially with a current route between the internal terminals 143b~144b in FIG. 10, the impedance can be reduced.

INDUSTRIAL APPLICABILITY

The invention can apply not only to a motor controller (such as a matrix converter, an inverter and a servo controller) and a power supply apparatus (such as a UPS and a welding machine power supply) but also to an apparatus in which a power module, a capacitor, a reactor and the like must be connected together using a bus bar.

The invention claimed is:

1. A matrix converter power conversion apparatus comprising:
   an alternating current (AC) capacitor including linearly arranged first, second and third terminals respectively formed in three portions thereof;
   an Insulated Gate Bipolar Transistor (IGBT) including linearly arranged first, second and third input terminals respectively formed in three portions thereof; and
   a bus bar for connecting together the three-portion terminals of the AC capacitor and the three-portion input terminals of the IGBT, wherein
   the AC capacitor and the IGBT are disposed such that the linearly arranged terminals of the AC capacitor and the linearly arranged input terminals of the IGBT are parallel to each other and the first, second and third input terminals of the IGBT are respectively close to the first, second and third terminals of the AC capacitor, and
   the bus bar is formed as a laminate bus bar provided in such a manner that three plate-shaped bus bars are laminated on top of each other and insulators are inserted between the respective bus bars as well as on the front and back surfaces of the bus bars,
   in the respective plate-shaped bus bars, there are provided internal terminals for connecting together the three-portion terminals of the AC capacitor and the three-portion input terminals of the IGBT, the internal terminals being formed at positions where the internal terminals are not laminated on top of each other, and the bus bars being shaped to adjoin each other on an entire surface of a substantially rectangular area where current routes of the bus bars are laminated on top of each other,
   in the three plate-shaped bus bars, there are formed hole portions which respectively penetrate through between the first terminal and the first input terminal and through between the third terminal and the third input terminal, and
   the current routes include a current route formed between the first terminal and the first input terminal and detouring the hole portions, and a current route formed between the third terminal and the third input terminal and detouring the hole portions are respectively set to substantially overlap a current route formed between the second terminal and the second input terminal, and
   the terminals of the AC capacitor and the input terminals of the IGBT are connected together through the internal terminals.

* * * * *